(12) United States Patent
Ding et al.

(10) Patent No.: US 9,309,149 B2
(45) Date of Patent: *Apr. 12, 2016

(54) SYSTEMS, METHODS, AND APPARATUS FOR PRODUCTION COATINGS OF LOW-EMISSIVITY GLASS

(71) Applicant: Intermolecular Inc., San Jose, CA (US)

(72) Inventors: Guowen Ding, San Jose, CA (US); Brent Boyce, Novi, MI (US); Jeremy Cheng, Cupertino, CA (US); Jose Ferreira, Rumelange (DE); Muhammad Imran, Brownstown, MI (US); Minh Huu Le, San Jose, CA (US); Daniel Schweigert, Fremont, CA (US); Yu Wang, San Jose, CA (US); Yongli Xu, Plymouth, MI (US); Guizhen Zhang, Santa Clara, CA (US)

(73) Assignees: Intermolecular, Inc., San Jose, CA (US); Guardian Industries Corp., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/144,828

(22) Filed: Dec. 31, 2013

(65) Prior Publication Data

US 2014/0308528 A1    Oct. 16, 2014

Related U.S. Application Data

(63) Continuation of application No. 61/778,758, filed on Mar. 13, 2013.

(51) Int. Cl.
| | |
|---|---|
| *C03C 17/36* | (2006.01) |
| *C03C 17/34* | (2006.01) |
| *C03C 25/22* | (2006.01) |
| *C23C 14/08* | (2006.01) |
| *C23C 14/06* | (2006.01) |
| *C23C 14/00* | (2006.01) |

(52) U.S. Cl.
CPC .......... *C03C 17/366* (2013.01); *C03C 17/3435* (2013.01); *C03C 17/3618* (2013.01); *C03C 17/3626* (2013.01); *C03C 17/3644* (2013.01); *C23C 14/0652* (2013.01); *C23C 14/0688* (2013.01); *C23C 14/083* (2013.01); *C23C 14/086* (2013.01); *C03C 17/3681* (2013.01);
(Continued)

(58) Field of Classification Search
CPC    C03C 17/36; C03C 17/3618; C03C 17/3626; C03C 17/3639; C03C 17/366; C03C 17/3681; C03C 17/3644; C03C 17/3435; C03C 25/226; C03C 2218/155; C23C 14/0021; C23C 14/0036; C23C 14/0652; C23C 14/0688; C23C 14/083; C23C 14/086
See application file for complete search history.

(56) References Cited

U.S. PATENT DOCUMENTS

| 5,110,637 A | 5/1992 | Ando |
| 6,833,194 B1 | 12/2004 | O'Shaughnessy |

(Continued)

*Primary Examiner* — Michael Band

(57) ABSTRACT

Disclosed herein are systems, methods, and apparatus for forming a low emissivity panel. In various embodiments, a partially fabricated panel may be provided. The partially fabricated panel may include a substrate, a reflective layer formed over the substrate, and a top dielectric layer formed over the reflective layer such that the reflective layer is formed between the substrate and the top dielectric layer. The top dielectric layer may include tin having an oxidation state of +4. An interface layer may be formed over the top dielectric layer. A top diffusion layer may be formed over the interface layer. The top diffusion layer may be formed in a nitrogen plasma environment. The interface layer may substantially prevent nitrogen from the nitrogen plasma environment from reaching the top dielectric layer and changing the oxidation state of tin included in the top dielectric layer.

10 Claims, 4 Drawing Sheets

(52) U.S. Cl.
CPC ......... *C03C 25/226* (2013.01); *C03C 2218/155* (2013.01); *C23C 14/0036* (2013.01)

(56) References Cited

U.S. PATENT DOCUMENTS

| | | | |
|---|---|---|---|
| 7,846,549 B2 | 12/2010 | Novis | |
| 7,901,781 B2 | 3/2011 | Maschwitz | |
| 8,187,713 B2 | 5/2012 | Lemmer | |
| 8,557,391 B2 * | 10/2013 | Frank et al. | 428/434 |
| 8,679,633 B2 * | 3/2014 | Imran et al. | 428/432 |
| 2007/0036989 A1 | 2/2007 | Medwick | |
| 2007/0036990 A1 | 2/2007 | Dietrich | |
| 2010/0279144 A1 | 11/2010 | Frank | |
| 2010/0295330 A1 * | 11/2010 | Ferreira et al. | 296/84.1 |
| 2013/0164464 A1 * | 6/2013 | Lage et al. | 428/34 |
| 2014/0268316 A1 * | 9/2014 | Zhang et al. | 359/359 |
| 2014/0322507 A1 * | 10/2014 | Ding et al. | 428/216 |

* cited by examiner

SYSTEMS, METHODS, AND APPARATUS FOR PRODUCTION COATINGS OF LOW-EMISSIVITY GLASS

CROSS-REFERENCE TO RELATED APPLICATIONS

This application claims the benefit under 35 U.S.C. §119 (e) of U.S. Provisional Patent Application 61/778,758, filed on 2013 Mar. 13, which is incorporated herein by reference in its entirety for all purposes.

TECHNICAL FIELD

The present disclosure relates generally to films providing high transmittance and low emissivity, and more particularly to such films deposited on transparent substrates.

BACKGROUND

Sunlight control materials, such as treated glass sheets, are commonly used for building glass windows and vehicle windows. Such materials typically offer high visible transmission and low emissivity thereby allowing more sunlight to pass through the glass window while block infrared (IR) radiation to reduce undesirable interior heating. In low emissivity (low-E) materials, IR radiation is mostly reflected with minimum absorption and emission, thus reducing the heat transferring to and from the low emissivity surface. Low-E panels are often formed by depositing a reflective layer (e.g., silver) onto a substrate, such as glass. The overall quality of the reflective layer is important for achieving the desired performance. In order to provide adhesion, as well as protection, several other layers are typically formed both under and over the reflective layer. These layers typically include dielectric layers, such as silicon nitride, tin oxide, and zinc oxide, which provide protect the stack from both the substrate and the environment. The dielectric layer may also act as optical fillers and function as anti-reflective coating layers to improve the optical characteristics of the panel.

A typical approach to reduce emissivity involves increasing the thickness of the reflective layer (e.g., the silver layer). However, as the thickness of the reflective layer increases, the visible light transmission of this layer is also reduced. Furthermore, the high thickness slows manufacturing throughput and increases costs. It may be desirable to keep the reflective layer as thin as possible, while still providing emissivity suitable for low-e applications.

SUMMARY

Disclosed herein are systems, methods, and apparatus for forming low-emissivity (low-E) panels. In some embodiments, the methods may involve providing a partially fabricated panel. The partially fabricated panel may include a substrate, a reflective layer formed over the substrate, and a top dielectric layer formed over the reflective layer such that the reflective layer is formed between the substrate and the top dielectric layer. The top dielectric layer may include tin having an oxidation state of +4. The methods may proceed with forming an interface layer over the top dielectric layer and forming a top diffusion layer over the interface layer. The top diffusion layer is formed in a nitrogen plasma environment. In some embodiments, the interface layer has a band gap of at least 3.0 eV. In some embodiments, a material of the interface layer may be at least about 25% amorphous. The interface layer substantially prevents nitrogen from the nitrogen plasma environment from reaching the top dielectric layer.

The interface layer may directly interface the top diffusion layer and the top dielectric layer. In some embodiments, tin of the top dielectric layer is formed from one of tin oxide, zinc tin oxide, aluminum tin oxide, magnesium tin oxide, bismuth tin oxide, or niobium tin oxide. A material of the interface layer may be at least about 50% amorphous. Moreover, a material of the interface layer may be less than 5% crystalline by volume, as determined by X-ray diffraction. The interface layer may include one of zinc oxide, titanium oxide, or tantalum oxide. The interface layer may have a thickness of between about 2 nanometers and 8 nanometers. The top diffusion layer may include silicon nitride. The top diffusion layer may be formed using sputtering of a silicon target in a nitrogen plasma environment. In some embodiments, the partially fabricated panel also includes a barrier layer formed between the reflective layer and the dielectric layer. The barrier layer may include nickel, titanium, and niobium. In some embodiments, the partially fabricated panel further includes a bottom diffusion layer deposited or formed between the substrate and the reflective layer, a bottom dielectric layer deposited or formed between the bottom diffusion layer and the substrate, and a seed layer formed between the bottom dielectric layer and the reflective layer.

The methods may involve, after forming the top diffusion layer, heat treating the partially fabricated panel. During this heat treatment, the partially fabricated panel may include the interface layer and the top diffusion layer. A change in a substrate-side reflectance of this partially fabricated panel may be less than 3% after heat treating.

In some embodiments, the interface layer may be formed using a deposition technique, such as reactive sputtering. The top diffusion layer may include silicon nitride. The interface layer includes zinc oxide, while the top dielectric layer includes zinc tin oxide. Substantially all tin in the dielectric layer may have the oxidation state of +4.

Also disclosed herein are methods of forming a low emissivity panel. In some embodiments, the methods involve providing a partially fabricated panel. The partially fabricated panel includes a glass substrate, a reflective layer formed over the glass substrate, and a top dielectric layer formed over the reflective layer such that the reflective layer is formed between the substrate and the dielectric layer. The top dielectric layer includes zinc tin oxide. The methods proceed with forming an interface layer over the top dielectric layer. The interface layer includes zinc oxide and has a thickness of between about 2 nm and 8 nm. Moreover, the interface layer may have a band gap of at least 3.0 eV. In some embodiments, a material of the interface layer is at least about 50% amorphous. The methods proceed with forming a top diffusion layer over the interface layer. The top diffusion layer includes silicon nitride and may be formed using reactive sputtering in a nitrogen plasma environment. In some embodiments, the interface layer substantially prevents nitrogen from the nitrogen plasma environment from reaching the top dielectric layer and changing an oxidation state of tin in the top dielectric layer.

Also disclosed herein are low emissivity panels. In some embodiments, the panels may include a substrate, a reflective layer formed over the substrate, a top dielectric layer formed over the reflective layer such that the reflective layer is formed between the substrate and the top dielectric layer. The top dielectric layer also includes tin having an oxidation state of +4. The panels also include an interface layer formed over the top dielectric layer such that the top dielectric layer is formed between the reflective layer and the interface layer. The interface layer may include one of zinc oxide, titanium oxide, or tantalum oxide. Moreover, the interface layer may have a band gap of at least 3.0 eV. In some embodiments, a material of the interface layer is at least about 50% amorphous. The panels also include a top diffusion layer formed over the interface layer such that the interface layer is formed between the top dielectric layer and the interface layer. The top diffusion layer includes silicon nitride.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION OF EXAMPLE EMBODIMENTS

Figure 1:
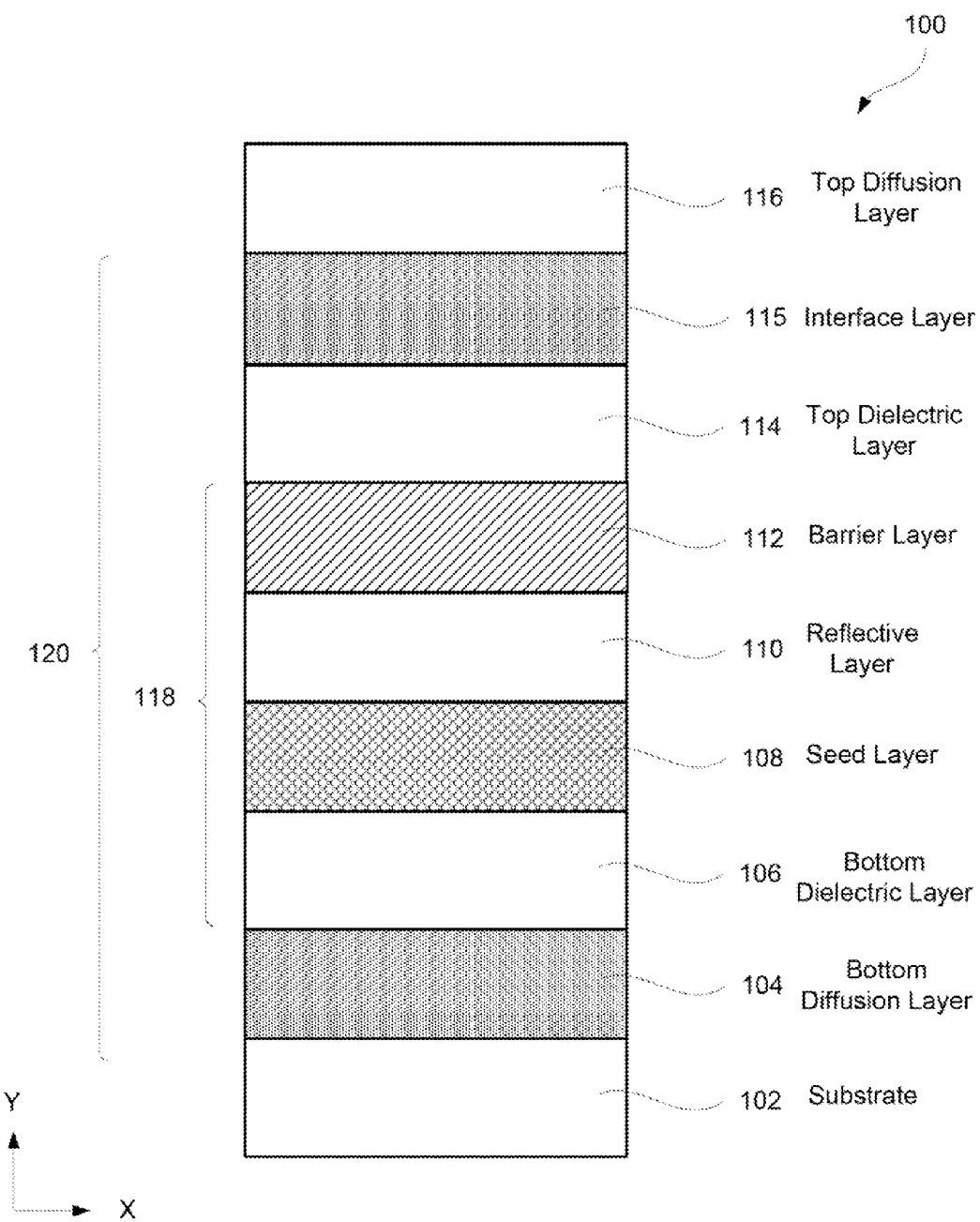
FIG. 1 is a schematic illustration of an article including a substrate and a stack of layers including one reflective layer formed over the substrate, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

INTRODUCTION

Provided are methods of forming low emissivity panels having top dielectric layers protected by interface layers during subsequent processing of the panels. Also provided are panels formed by such methods. A low emissivity panel may include a top dielectric layer formed by tin oxide, zinc tin oxide, aluminum tin oxide, magnesium tin oxide, bismuth tin oxide, or niobium tin oxide. Tin of the top dielectric layer may be predominantly in an oxidation state of +4 providing suitable optical transmission properties to the top dielectric layer. However, this oxidation state is unstable, and tin can easily transition into +2 oxidation state, which reduces transmission of the top dielectric layer. The top dielectric layer is particularly susceptible to this change in tin's oxidation state and deterioration of the layer's transmission properties when a top diffusion layer is formed over the top dielectric layer. The top diffusion layer is typically formed by reactive sputtering of silicon in a nitrogen plasma environment. The activated nitrogen in the nitrogen plasma environment is very reactive and can easily convert tin from one oxidation into another. Specifically, when the top dielectric layer is exposed to the nitrogen plasma environment it may undergo the undesired changes describe above.

Conventional methods of fabricating low emissivity panels may use top dielectric layers that do not couple or connect to nitrides well. Thus, conventional methods do not provide good coupling between the top dielectric layer and the top diffusion layer. Moreover, conventional methods do not isolate and protect the top dielectric layer from changes in its oxidation state which may occur during deposition of the top diffusion layer, or during subsequent manufacturing processes, such as a heat treatment that may be used to temper the glass. Furthermore, conventional methods to not provide protection for the top dielectric layer in a way that is compatible with multiple manufacturing processes. For example, conventional production coatings in low emissivity panels may be different for an as-coated (AC) panel than those used for a heat treatment (HT) panel. The use of different production coatings for different processes results in increased costs and increased production times.

In some embodiments disclosed herein, in order to protect the top dielectric layer and maintain its optical transmission properties, an interface layer is formed over the top dielectric layer before forming any other layers or exposing the top dielectric layer to any damaging environments, such as nitrogen plasma. The interface layer may be formed from high band gap materials that are highly transmissive and have strong oxygen bonds. Some examples of such materials include zinc oxide, titanium oxide, and tantalum oxides. The thickness of the interface layer may be between about 2 nm and 8 nm or, more specifically, between about 3 nm and 5 nm. A thinner interface layer may not be sufficiently conformal and/or protective. On the other hand, a thicker interface layer may be more susceptible to crystallization, which may be undesirable. In some embodiments, the interface layer is at least about 25% amorphous or even at least about 50% amorphous.

The interface layer prevents contact between tin in the top dielectric layer and nitrogen in the plasma used to form the top diffusion layer. Furthermore, the interface layer prevents oxygen migration from the top dielectric layer. Overall, the interface layer substantially inhibits changes in the oxidation state of tin in the top dielectric layer resulting in more stable transmissive and color properties of the top dielectric layer. While the effects of the interface layer may be the most prominent during formation of the top diffusion layer, the interface layer may also protect the top dielectric layer even after the top diffusion layer is formed. For example, a low emissivity panel may be subjected to heat treatment or forming additional layers over the top diffusion layer. Such processes may cause materials to diffuse in or out of the top dielectric layer if the interface layer is not present. The interface layer may be used in low emissivity panels that are later subject to heat treatment as well as in low emissivity panels that are used without subsequent heat treatment.

Examples of Low-Emissivity Coatings

A brief description of low-E coatings is provided for context and better understanding of various features associated with barrier layers and silver reflective layers. One having ordinary skills in the art would understand that these barrier and silver reflective layers may be also used for other applications, such as light emitting diodes (LED), reflectors, and other like applications. Some characteristics of low-E coatings are applicable to these other applications as well. For purposes of this disclosure, low-E is a quality of a surface that emits low levels of radiant thermal energy. Emissivity is the value given to materials based on the ratio of heat emitted compared to a blackbody, on a scale of 0 (for a perfect reflector) to 1 (for a back body). The emissivity of a polished silver surface is 0.02. Reflectivity is inversely related to emissivity. When values of reflectivity and emissivity are added together, their total is equal 1.

FIG. 1 is a schematic illustration of an article 100 including a substrate 102 and a stack 120 of layers 104-116, in accordance with some embodiments. Specifically, stack 120 includes one reflective layer 110 formed over substrate 102 and protected by a barrier layer 112. Other layers in stack 120 may include bottom diffusion layer 104, top diffusion layer 116, bottom dielectric layer 106, top dielectric layer 114, and seed layer 108. Each one of these components will now be described in more details. One having ordinary skills in the art would understand that the stack may include fewer layers or more layers as, for example, described below with reference to FIGS. 2 and 3.

Substrate 102 can be made of any suitable material. Substrate 102 may be opaque, translucent, or transparent to the visible light. For example, for low-E applications, the substrate may be transparent. Specifically, a transparent glass substrate may be used for this and other applications. For purposes of this disclosure, the term "transparency" is defined as a substrate characteristic related to a visible light transmittance through the substrate. The term "translucent" is defined as a property of passing the visible light through the substrate and diffusing this energy within the substrate, such that an object positioned on one side of the substrate is not visible on the other side of the substrate. The term "opaque" is defined as a visible light transmittance of 0%. Some examples of suitable materials for substrate 102 include, but are not limited to, plastic substrates, such as acrylic polymers (e.g., polyacrylates, polyalkyl methacrylates, including polymethyl methacrylates, polyethyl methacrylates, polypropyl methacrylates, and the like), polyurethanes, polycarbonates, polyalkyl terephthalates (e.g., polyethylene terephthalate (PET), polypropylene terephthalates, polybutylene terephthalates, and the like), polysiloxane containing polymers, copolymers of any monomers for preparing these, or any mixtures thereof. Substrate 102 may be also made from one or more metals, such as galvanized steel, stainless steel, and aluminum. Other examples of substrate materials include ceramics, glass, and various mixtures or combinations of any of the above.

Bottom diffusion layer 104 and top diffusion layer 116 may be two layers of stack 120 that protect the entire stack 120 from the environment and improve chemical and/or mechanical durability of stack 120. Diffusion layers 104 and 116 may be made from the same or different materials and may have the same or different thickness. In some embodiments, one or both diffusion layers 104 and 116 are formed from silicon nitride. In some embodiments, silicon nitride may be doped with aluminum and/or zirconium. The dopant concentration may be between about 0% to 20% by weight. In some embodiments, silicon nitride may be partially oxidized. Silicon nitride diffusion layers may be silicon-rich, such that their compositions may be represented by the following expression, $Si_xN_y$, where the X-to-Y ratio is between about 0.8 and 1.0. The refraction index of one or both diffusion layers 104 and 116 may be between about 2.0 and 2.5 or, more specifically, between about 2.15 to 2.25. The thickness of one or both diffusion layers 104 and 116 may be between about 50 Angstroms and 300 Angstroms or, more specifically, between about 100 Angstroms and 200 Angstroms.

In addition to protecting stack 120 from the environment, bottom diffusion layer 104 may help with adhering bottom dielectric layer 106 to substrate 102. Without being restricted to any particular theory, it is believed that deposition of dielectric layer 106 and in particular subsequent heat treatment of this layer results in heat-induced mechanical stresses at the interfaces of dielectric layer 106. These stresses may cause delamination of dielectric layer 106 from other layers and coating failure. A particular example is a titanium oxide layer deposited directly onto the glass substrate. However, when silicon nitride diffusion layer 104 is provided between bottom dielectric layer 106 and substrate 102, the adhesion within this three-layer stack remains strong as evidenced by improved durability, especially after heat treatment.

Typically, each reflective layer provided in a stack is surrounded by two dielectric layers, e.g., bottom dielectric layer 106 and top dielectric layer 114 as shown in FIG. 1. Dielectric layers 106 and 114 are used to control reflection characteristics of reflective layer 110 as well as overall transparency and color of stack 120 and, in some embodiments, of article 100. Dielectric layers 106 and 114 may be made from the same or different materials and may have the same or different thickness. In some embodiments, one or both dielectric layers 106 and 114 are formed from $TiO_2$, ZnO, $SnO_2$, SiAlN, or ZnSn. In general, dielectric layers 106 and 114 may be formed from various oxides, stannates, nitrides, and/or oxynitrides. In some embodiments, one or both dielectric layers 106 and 114 may include dopants, such as Al, Ga, In, Mg, Ca, Sr, Sb, Bi, Ti, V, Y, Zr, Nb, Hf, or Ta. Dielectric layers 106 and 114 can each include different dielectric materials with similar refractive indices or different materials with different refractive indices. The relative thicknesses of the dielectric films can be varied to optimize thermal-management performance, aesthetics, and/or durability of article 100.

The materials of dielectric layers 106 and 114 may be in amorphous phases, crystalline phases, or a combination of two or more phases. In some embodiments, when stack 120 includes seed layer 108, bottom dielectric layer 106 may be in an amorphous phase. Alternatively, when stack 120 does not include seed layer 108, bottom dielectric layer 106 may be in a crystalline phase and function as a nucleation template for overlying layers, e.g., reflective layer 110. In some embodiments, a crystalline phase may be greater than 30% crystalline as determined by X-ray diffraction. The thickness of dielectric layers 106 and 114 may be between about 50 Angstroms and 1000 Angstroms or, more specifically, between 100 Angstroms and 300 Angstroms.

In some embodiments, stack 120 includes seed layer 108. Seed layer 108 may be formed from ZnO, $SnO_2$, $Sc_2O_3$, $Y_2O_3$, $TiO_2$, $ZrO_2$, $HfO_2$, $V_2O_5$, $Nb_2O_5$, $Ta_2O_5$, $CrO_3$, $WO_3$, $MoO_3$, various combinations thereof, or other metal oxides. The material of seed layer 108 may be in a crystalline phase. Seed layer 108 may function as a nucleation template for overlying layers, e.g., reflective layer 110. In some embodiments, the thickness of seed layer 108 is between about 50 Angstroms and 200 Angstroms, such as about 100 Angstroms.

Stack 120 includes reflective layer 110, which is formed from silver. The thickness of this layer may be between about 50 Angstroms and 200 Angstroms or, more specifically, between about 100 Angstroms and 150 Angstroms.

As noted above, stack 120 also includes barrier layer 112 to protect reflective layer 110 from oxidation and other damage.

Barrier layer 112 may be formed from a quaternary alloy that includes nickel, chromium, titanium, and aluminum. The concentration of each metal in this alloy is selected to provide adequate transparency and oxygen diffusion blocking properties. In some embodiments, a combined concentration of nickel and chromium in the barrier layer is between about 20% by weight and 50% by weight or, more specifically, between about 30% by weight and 40% by weight. A weight ratio of nickel to chromium in the alloy may be between about 3 and 5 or, more specifically, about 4. A weight ratio of titanium to aluminum is between about 0.5 and 2, or more, specifically about 1. In some embodiments, the concentration of nickel in the barrier layer is between about 5% and 10% by weight, the concentration of chromium—between about 25% and 30% by weight, the concentration of titanium and aluminum—between about 30% and 35% by weight each. This composition of barrier layer 112 may be achieved by using one or more sputtering targets containing nickel, chromium, titanium, and aluminum, controlling concentration of these metals in the sputtering targets, and controlling power levels applied to each sputtering target. For example, two sputtering targets may be used. The first target may include nickel and chromium, while the second target may include titanium and aluminum. The weight ratio of nickel to chromium in the first target may be about 4, while the weight ratio of titanium to aluminum in the second target may be about 1. These weight ratios may be achieved by using corresponding alloys for the entire target, target inserts made from different materials, or other features allowing combination of two or more materials in the same target. The two targets may be exposed to different power levels. In the above example, the first target may be exposed to twice smaller power than the second target to achieve the desired composition. The barrier can be deposited substantially free of oxygen (e.g., predominantly as a metal) in the inert environment (e.g., argon environment). Alternatively, some oxidant (e.g., 15% by volume of $O_2$ in Ar) may be used to oxide the four metals. The concentration of oxygen in the resulting barrier layer may be between about 0% and 5% by weight.

In some embodiments, nickel, chromium, titanium, and aluminum are all uniformly distributed throughout the barrier layer, i.e., its entire thickness and coverage area. Alternatively, the distribution of components may be non-uniform. For example, nickel and chromium may be more concentrated along one interface than along another interface. In some embodiments, a portion of the barrier layer near the interface with the reflective layer includes more nickel for better adhesion to the reflective layer. In some embodiments, substantially no other components other than nickel, chromium, titanium, and aluminum are present in barrier layer 112.

Barrier layer 112 may be amorphous metal. For purposes of this disclosure, an amorphous metal (also known metallic glass or glassy metal) is a solid metallic material, usually an alloy, which may have less than 5% crystallinity by volume. For example, barrier layer 112 may be a layer of a material, such as NiTiNb which may be configured to have a thickness between about 1.5 nm and 5 nm. In some examples, barrier layer 112 has a thickness of 2.4 nm. Barrier layer 112 may be formed using a deposition technique, such as sputtering. During the forming process, a small amount of oxygen may be mixed with Argon to create a layer of NiTiNb oxide having an oxygen content between 10% to 30% by atomic weight. In some embodiments, barrier layer 112 may have a thickness of between about 1 Angstrom and 100 Angstroms or, more specifically, between about 5 Angstroms and 30 Angstroms, and even between about 10 Angstroms and 20 Angstroms.

Without being restricted to any particular theory, it is believed that when the barrier layer is exposed to oxygen (e.g., during deposition of the top dielectric), some metals of the barrier layer (e.g., Cr, Ti, and Al) will be easily oxidized thereby consuming oxygen and preventing oxygen from penetrating through the barrier layer and reaching the reflective layer. As such, the barrier layer may be considered as a scavenging layer.

Top dielectric layer 114 may be similar to bottom dielectric layer 106 described above. In some embodiments, top dielectric layer 114 may be configured to enhance coupling between top dielectric layer 114 and barrier layer 112. Top dielectric layer 114 may include, at least in part, tin oxide, zinc tin oxide, aluminum tin oxide, magnesium tin oxide, bismuth tin oxide, or niobium tin oxide. As previously discussed, barrier layer 112 may include a material, such as NiTiNb. In some embodiments, one or more materials included in top dielectric layer 114 might not be entirely compatible with and might not connect or couple well with nitrides, such as NiTiNb. Thus, according to some embodiments, top dielectric layer 114 may include, at least in part, a metal oxide, such as ZnO or ZnTiO. The inclusion of ZnO in top dielectric layer 114 may increase the compatibility and coupling between top dielectric layer 114 and barrier layer 112.

Top diffusion layer 116 may be similar to bottom diffusion layer 104 described above. In some embodiments, top diffusion layer 116 (e.g., formed from silicon nitride) may be more stoichiometric than bottom diffusion layer 104 to give better mechanical durability and a smoother surface. Bottom diffusion layer 104 (e.g., formed from silicon nitride) can be silicon-rich to make film denser for better diffusion effect.

Interface layer 115 may be a layer deposited between top dielectric layer 114 and top diffusion layer 116. Interface layer 115 may be configured to prevent changes in the oxidation state of top dielectric layer 114. Thus, interface layer 115 may prevent oxygen from migrating from or into top dielectric layer 114. For example, interface layer 115 may prevent tin included in top dielectric layer 114 from transitioning from a +4 oxidation state to a +2 oxidation state. Preventing changes in the oxidation state of top dielectric layer 114 preserves its transmissivity. For example, a change in a substrate-side reflectance of a partially fabricated panel that includes interface layer 115 and top diffusion layer 116 may be less than 3% after a heat treatment process. In this way, interface layer 115 may protect one or more optical and chemical characteristics of top dielectric layer 114 during the subsequent formation of other layers, such as top diffusion layer 116. Moreover, interface layer 115 may continue to protect top dielectric layer 114 during subsequent manufacturing processes, such as heat treatment of article 100. Thus, interface layer 115 may be configured to provide protection for top dielectric layer 114 in a way that is compatible with multiple fabrication processes that may be used when manufacturing article 100.

In some embodiments, interface layer 115 may include one or more materials that are highly transmissive and are high band gap materials that have strong oxygen bonds. For example, interface layer 115 may be made of a material that has a bandgap of at least 3 eV. Interface layer 115 is preferably highly transmissive to maintain a high transmissivity of article 100 which may be at least a portion of a panel of low-E glass. Moreover, the materials included in interface layer 115 preferably have oxygen bonds which are sufficiently strong to prevent oxygen migration during a deposition of additional layers on top of interface layer 115, and during subsequent manufacturing processes, such as heat treatment. Thus, the materials that form interface layer 115 preferably have a transmissivity which is high enough to preserve the optical performance of article 100, which may be low-E glass, and also have a presence of oxygen bonds strong enough to prevent the migration of oxygen from a layer, such as top dielectric layer 114, during deposition of another layer which may utilize a highly reactive environment, such as a nitrogen plasma environment, and during a subsequent manufacturing process, such as a heat treatment used to temper the low-E glass. In this way, interface layer 125 may substantially prevent nitrogen from the nitrogen plasma environment from reaching top dielectric layer 114 and changing the oxidation state of tin in top dielectric layer 114.

As similarly discussed above, interface layer 115 may include one or more materials that are highly transmissive and have a high band gap. In some embodiments, interface layer 115 may include one or more metal oxides, such as zinc oxide, titanium oxide, and tantalum oxide. For example, top dielectric layer 114 may include Zn2SnOx and interface layer 115 may include ZnO. As previously discussed above, top dielectric layer 114 may include a combination of Zn2SnOx and ZnO to increase coupling between top dielectric layer 114 and barrier layer 112, which may include NiTiNb, as well as to maintain high transmissivity of top dielectric layer 114. Returning to the previous example, interface layer 115 may be an additional layer of ZnO that is highly transmissive and isolates and protects top dielectric layer 114 from changes in oxidation states.

In some embodiments, interface layer 115 has a thickness which is configured to provide a high transmissivity while also providing a barrier to migration of oxygen from top dielectric layer 114. If interface layer 115 is too thin, interface layer 115 might not provide sufficient isolation between top dielectric layer 114 and top diffusion layer 116 to maintain the optical and chemical properties of top dielectric layer 114. For example, if interface layer 115 is too thin, it might not be able to prevent the migration of materials into and out of top dielectric layer 114. Moreover, if interface layer 115 is too thick, various undesirable results may occur. For example, interface layer 115 might not be sufficiently transmissive to meet specification requirements for the low-E panel. Moreover, if interface layer 115 is too thick, undesirable results may occur as a result of subsequent processing and manufacturing steps, such as crystallization which may occur during a heat treatment. In such a case, the transmission and isolation characteristics of interface layer 115 may be degraded after the application of a heat treatment, and the transmissivity of article 100 may be reduced.

Accordingly, interface layer 115 may be configured to have a thickness that maintains high transmissivity while also providing isolation/protection of top dielectric layer 114. Applicants have determined that interface layer 115 may be configured to have a thickness between 2 nm and 8 nm. When configured to have such a thickness, interface layer 115 is highly transmissive and provides good isolation of top dielectric layer 114. Interface layer 115 may be further configured to have a thickness between 3 nm and 5 nm. In one example, interface layer 115 has a thickness of 4 nm.

Interface layer 115 may also be configured to have a particular form or structure that further provides isolation and/or protection of top dielectric layer 114. For example, interface layer 115 may include an amorphous material, such as amorphous ZnO. In some embodiments, interface layer 115 may be partially amorphous, and may be at least about 25% amorphous. In some embodiments, interface layer 115 may be at least about 50% amorphous. Furthermore, interface layer 115 may be configured such that it is made of a material that is entirely amorphous.

In some embodiments, reflective layer 110 included in stack 120 may have a sheet resistance of between about 6 Ohm/square to 8 Ohm/square for a thickness of a silver reflective layer between 80 Angstroms and 90 Angstroms. The sheet resistance may be between about 2 Ohm/square to 4 Ohm/square for a thickness of a silver reflective layer between 100 Angstroms and 140 Angstroms.

In some embodiments, a stack may include multiple reflective layers in order to achieve a specific performance. For example, the stack may include two, three, or more reflective layers. The multiple reflective layers may have the same or different composition and/or thicknesses. Each new reflective layer may have a corresponding dielectric layer (e.g., at least one layer formed in between two reflective layers), a seed layer, and a barrier layer. FIG. 1 illustrates a portion 118 of stack 120 that may be repeated. Stack portion includes dielectric layer 106 (or dielectric layer 114), seed layer 108, reflective layer 110, and barrier layer 112. In some embodiments, portion 118 may not include seed layer 108.

Figure 2:
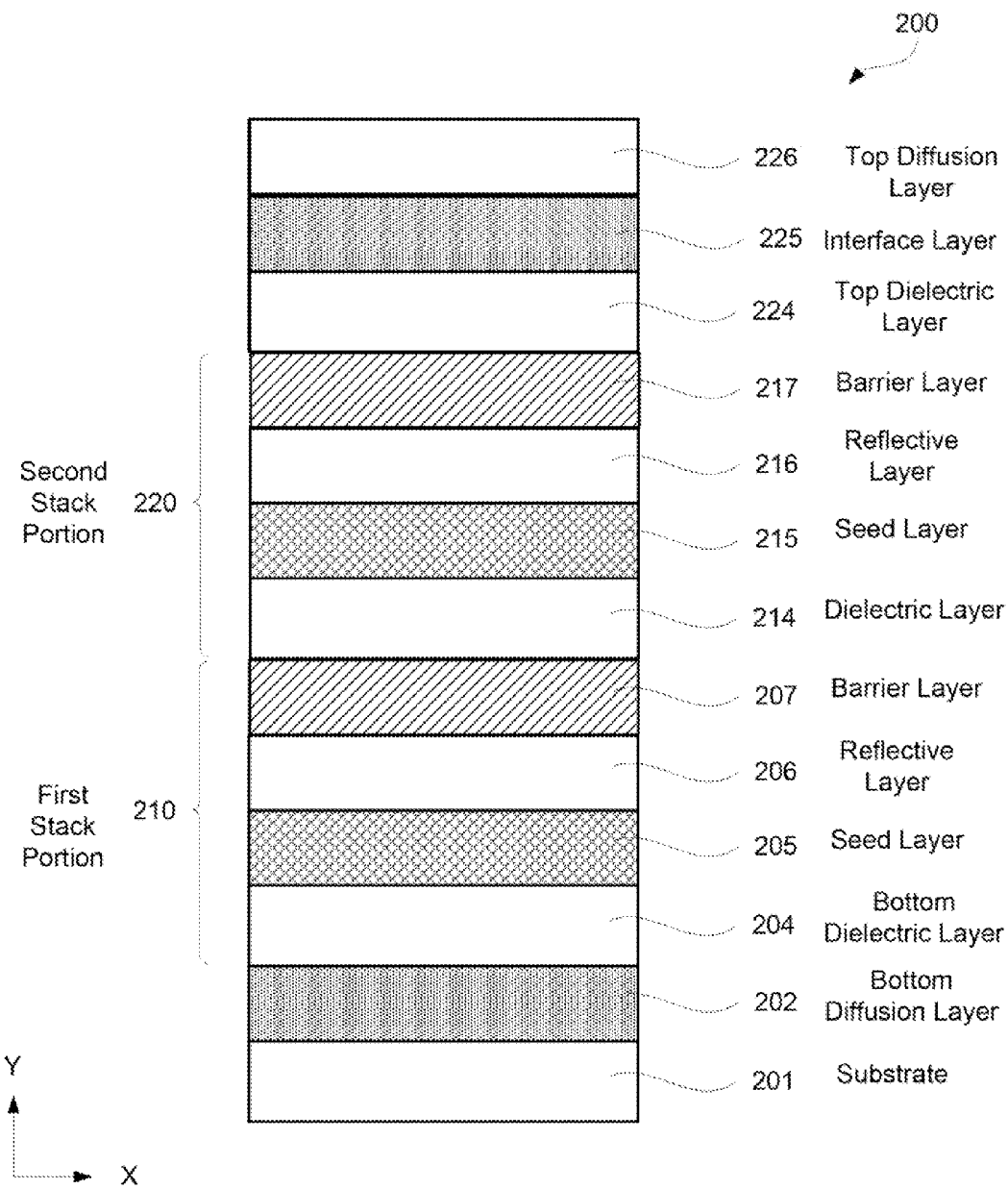
FIG. 2 is a schematic illustration of another article including a substrate and a stack of layers including two reflective layers formed over the substrate, in accordance with some embodiments.

FIG. 2 is a schematic illustration of another article 200 including a substrate 201 and a stack including two reflective layers 206 and 216, in accordance with some embodiments. Each one of reflective layers 206 and 216 is a part of a separate stack portion that includes other layers, i.e., reflective layer 206 is a part of first stack portion 210, while reflective layer 216 is a part of second stack portion 220. Other layers in first stack portion 210 include dielectric layer 204, seed layer 205, and barrier layer 207. Likewise, in addition to reflective layer 216, second stack portion 220 includes dielectric layer 214, seed layer 215, and barrier layer 217. It should be noted that reflective layers 206 and 216 are separated by only one dielectric layer 214. The overall article 200 also includes bottom diffusion layer 202, top dielectric layer 224, and top diffusion layer 226. Article 200 may further include interface layer 225. As similarly discussed above with reference to FIG. 1, a reflective layer, such as reflective layer 216, may include silver. Moreover, a dielectric layer may include $TiO_2$, ZnO, $SnO_2$, SiAlN, or ZnSn. Furthermore, a barrier layer may include an alloy that includes one or more of nickel, chromium, titanium, and aluminum. In some embodiments, a seed layer may include a metal oxide, such as zinc oxide. Moreover, a diffusion layer may include silicon nitride. An interface layer, such as interface layer 225, may include at least one of zinc oxide, titanium oxide, and tantalum oxide.

Figure 3:
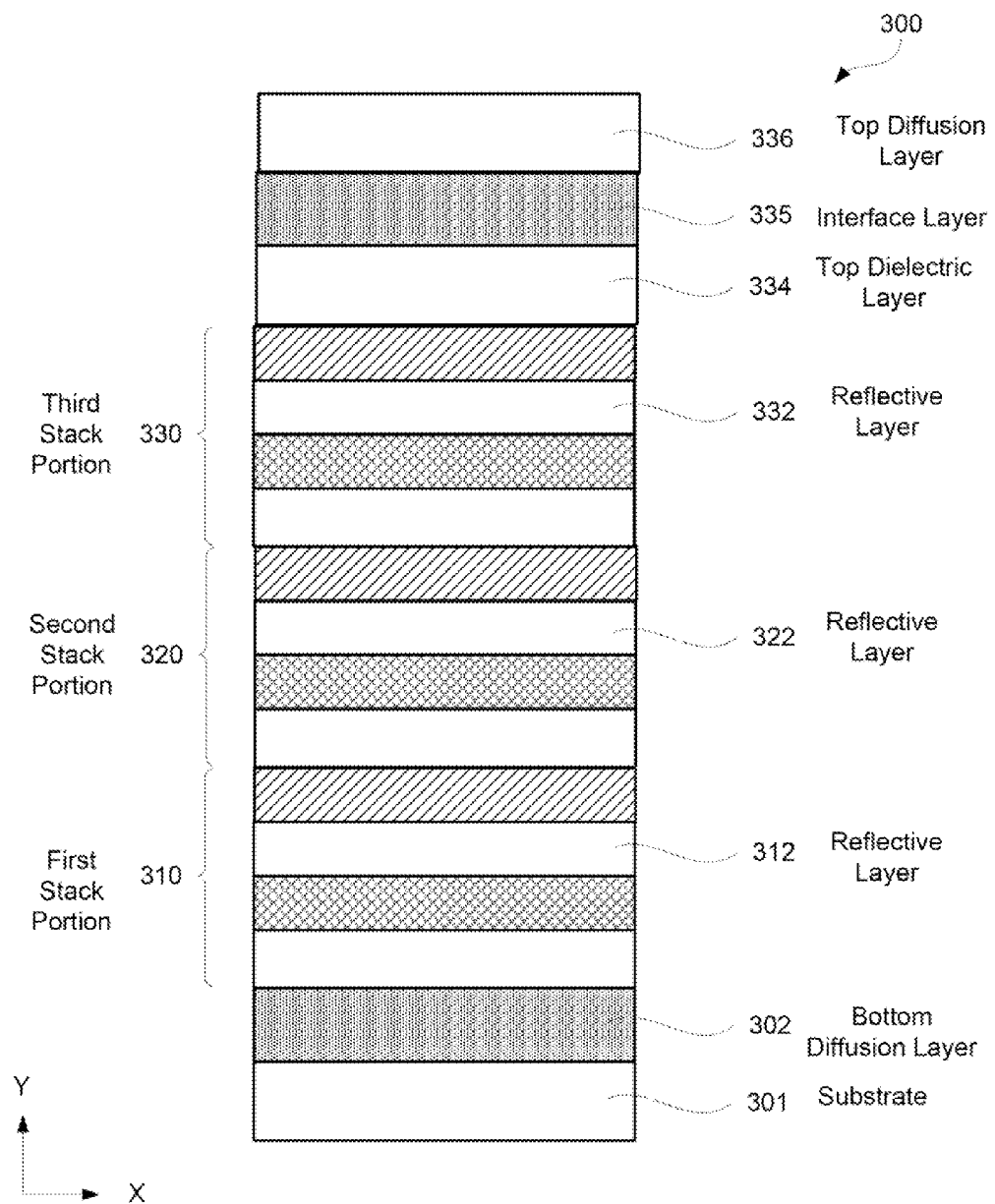
FIG. 3 is a schematic illustration of yet another article including a substrate and a stack of layers including three reflective layers formed over the substrate, in accordance with some embodiments.

FIG. 3 is a schematic illustration of yet another article 300 including a substrate 301 and three reflective layers, each being a part of as separate stack portion. Specifically, article 300 includes first stack portion 310 having reflective layer 312, second stack portion 320 having reflective layer 322, and third stack portion 330 having reflective layer 332. Other layers of article 300 also include bottom diffusion layer 302, top dielectric layer 334, and top diffusion layer 336. Article 300 may further include interface layer 335. As similarly discussed above with reference to FIG. 1 and FIG. 2, a reflective layer, such as reflective layer 322, may include silver. Moreover, a dielectric layer may include $TiO_2$, ZnO, $SnO_2$, SiAlN, or ZnSn. Furthermore, a barrier layer may include an alloy that includes one or more of nickel, chromium, titanium, and aluminum. In some embodiments, a seed layer may include a metal oxide, such as zinc oxide. Moreover, a diffusion layer may include silicon nitride. An interface layer, such as interface layer 335, may include at least one of zinc oxide, titanium oxide, and tantalum oxide.

Processing Examples

Figure 4:
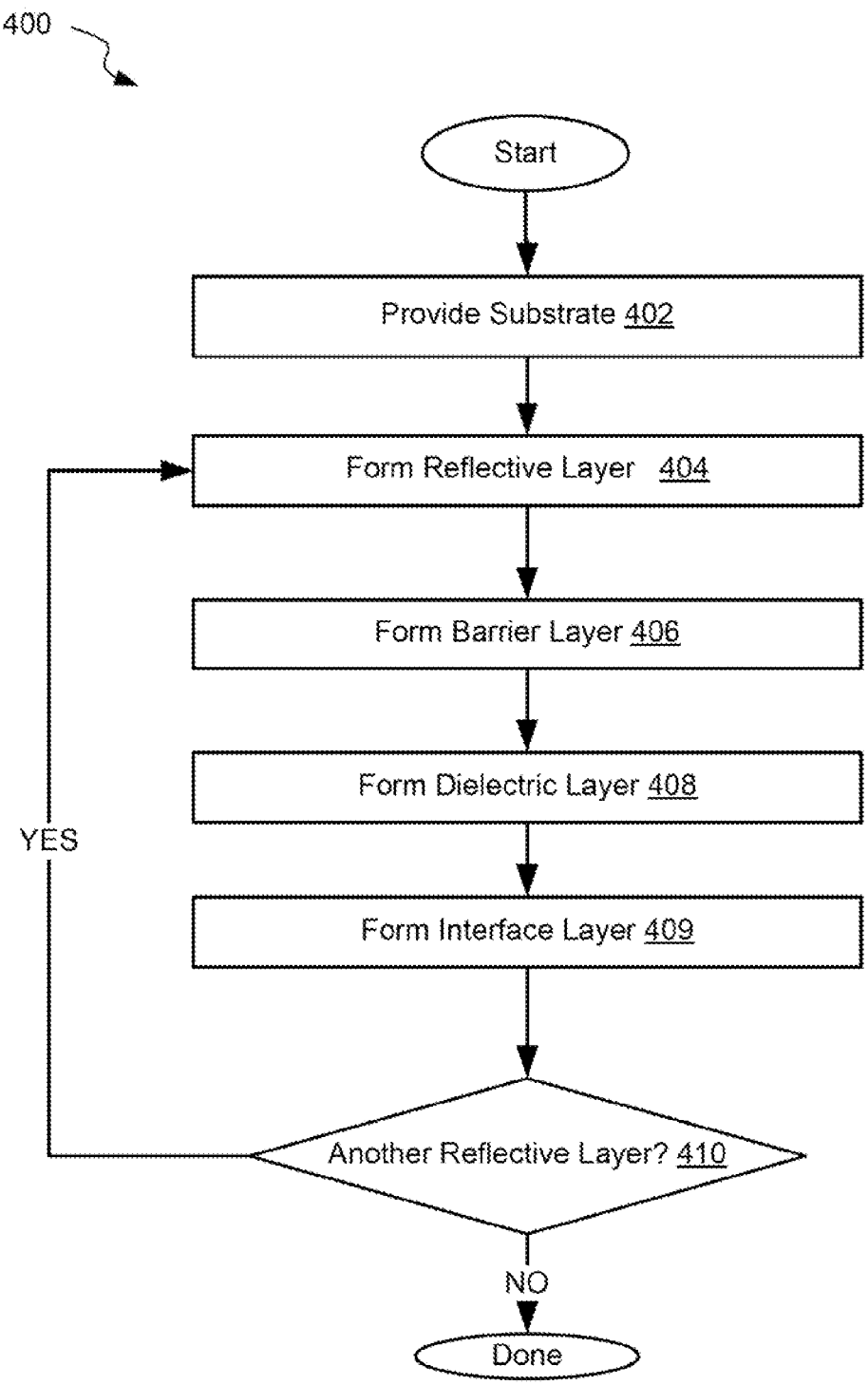
FIG. 4 is a process flowchart corresponding to a method for forming an article including a reflective layer and a barrier layer for protecting materials in this reflective layer from oxidation, in accordance with some embodiments.

FIG. 4 is a process flowchart corresponding to a method 400 of forming an article including a silver reflective layer and a barrier layer for protecting this reflective layer from oxidation, in accordance with some embodiments. Method 400 may commence with providing a substrate during operation 402. In some embodiments, the provided substrate is a glass substrate. The substrate may include one or more previous deposited layers. For example, the substrate may include a bottom diffusion layer, a bottom dielectric layer, and a seed layer. In some embodiments, one of more of these layers may not be present on the substrate. Various examples of these layers and substrates are described above with reference to FIG. 1.

Method 400 may proceed with forming a reflective layer over the substrate during operation 404 or, more specifically, over one or more layers previously formed on the provided substrate. This operation may involve sputtering silver in a non-reactive environment. The silver layer may be deposited in an argon environment at a pressure of 2 millitorr using 90 W power applied over a sputter area of about 12 cm$^2$ resulting in a power density of about 7500 W/m$^2$. The resulting deposition rate was about 2.9 Angstroms per second. The target to substrate spacing was about 240 millimeters. The thickness of the reflective layer may be between about 50 Angstroms and 200 Angstroms. In some embodiments, the same reflective layer is provided in all site isolated regions of the substrate. In other words, the reflective layer has the same composition and thickness in all site isolated regions of the substrate. This uniformity may be used to provide control and vary, for example, parameters of another layer.

Method 400 may proceed with forming a barrier layer over the reflective layer during operation 406. As noted above, the reflective layer may be formed from a quaternary alloy including nickel, chromium, titanium, and aluminum that is formed by co-sputtering of these four metals in a non-reactive environment. In some embodiments, the barrier layer is deposited in the same processing chamber as the reflective layer without breaking the vacuum in the chamber. Overall, the reflective layer needs to be protected from oxygen prior to deposition of the barrier layer. In some embodiments, a partially fabricated article may be maintained in an oxygen-free environment after forming the reflective layer and prior to forming the barrier layer.

Operation 406 may use a single sputtering target that includes all four metals. Alternatively, multiple targets, each including one or more metals, may be used. When a target includes multiple metals, these metals may be in a form of an alloy arranged into a unified body or may be present as separate components of the target. The composition of metals in the one or more targets may correspond to the desired composition of the barrier layer. For example, a target including 5-10% by weight of nickel, 25-30% by weight of chromium, 30-35% by weight of titanium, and 30-35% by weight of aluminum may be used. In some embodiments, one target may include nickel and chromium (e.g., having a 4:1 weight ratio of nickel to chromium) and another target may include titanium and aluminum (e.g., having a 1:1 weight ratio). The power level used on the titanium-aluminum target may double of that used for the nickel-chromium level, e.g., 200 W and 100 W respectively for 3-inch targets positioned about 12 inches away from the substrate resulting in a 2-4 Angstroms per minute deposition rate.

Method 400 may then proceed with forming a dielectric layer over the barrier layer during operation 408. This operation may involve sputtering titanium or tin in an oxygen containing environment. During this operation, the barrier layer prevents oxygen in the oxygen containing environment from reaching and reacting with metallic silver in the reflective layer.

At operation 409, an interface layer may be formed. As similarly discussed above, the interface layer may be made of a material that is highly transmissive and has a high band gap. For example, the interface layer may be made of a material, such as zinc oxide, titanium oxide, or tantalum oxide. The interface layer may be formed by a deposition technique, such as sputtering. The interface layer may be deposited until a particular thickness is achieved, such as between 2 nm and 8 nm.

As similarly discussed above, according to various embodiments, the same type of interface layer, and the same process for forming the interface layer may be used regardless of which type of fabrication process is used to form the article which may be a portion or part of a low-E panel. For example, the same deposition technique and the same interface layer may be used regardless of whether the low-E panel is fabricated in accordance with an as-coated process, or whether the low-E panel is fabricated in accordance with a heat treatment process.

If another reflective layer needs to be deposited on the substrate, operations 404-408 may be repeated as indicated by decision block 410.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method for forming a low emissivity panel, the method comprising:
   providing a partially fabricated panel,
      the partially fabricated panel comprising a substrate, a reflective layer comprising Ag formed over the substrate, and a top dielectric layer formed over the reflective layer such that the reflective layer is formed between the substrate and the top dielectric layer, and
      wherein the top dielectric layer comprises tin having an oxidation state of +4 and further comprises zinc;
   forming an interface layer by reactive sputtering over the top dielectric layer,
      wherein the interface layer comprises one of titanium oxide or tantalum oxide;
   forming a top diffusion layer by sputtering over the interface layer,
      wherein the interface layer is in direct physical contact with both the to diffusion layer and the to dielectric layer,
      wherein the top diffusion layer is formed in a nitrogen plasma environment and comprises silicon nitride,
      wherein the interface layer has a band gap of at least 3.0 eV, and
      wherein a material of the interface layer is at least about 25% amorphous, and forming a barrier layer disposed between the reflective layer and the top dielectric layer, wherein the barrier layer comprises nickel, titanium, and niobium, and wherein the barrier layer is in direct physical contact with both the reflective layer and the top dielectric layer.

2. The method of claim 1, wherein a material of the interface layer is at least about 50% amorphous.

3. The method of claim 1, wherein a material of the interface layer is less than 5% crystalline by volume.

4. The method of claim 1, wherein the interface layer has a thickness of between about 2 nanometers and 8 nanometers.

5. The method of claim 1, wherein the top diffusion layer is formed using sputtering of a silicon target in the nitrogen plasma environment.

6. The method of claim 1, wherein the partially fabricated panel further comprises a bottom diffusion layer deposited between the substrate and the reflective layer, a bottom dielectric layer deposited between the bottom diffusion layer and the reflective layer, and a seed layer formed between the bottom dielectric layer and the reflective layer.

7. The method of claim 1, further comprising, after forming the top diffusion layer, heat treating the partially fabricated panel comprising the interface layer and the top diffusion layer.

8. The method of claim 7, wherein a change in a substrate-side reflectance of the partially fabricated panel comprising the interface layer and the top diffusion layer is less than 3% after heat treating.

9. The method of claim 1, wherein substantially all tin in the top dielectric layer has the oxidation state of +4.

10. A method for forming a low emissivity panel, the method comprising:

providing a partially fabricated panel, the partially fabricated panel comprising a glass substrate, a reflective layer comprising Ag formed over the glass substrate, and a top dielectric layer formed over the reflective layer such that the reflective layer is formed between the substrate and the top dielectric layer, and wherein the top dielectric layer comprises zinc tin oxide;

wherein tin of the top dielectric layer has an oxidation state of +4;

forming an interface layer by reactive sputtering over the top dielectric layer, wherein the interface layer is in direct physical contact with both the to diffusion layer and the top dielectric layer, wherein the interface layer comprises one of titanium oxide or tantalum oxide and has a thickness of between about 2 nm and 8 nm, and wherein the interface layer has a band gap of at least 3.0 eV; and forming a top diffusion layer by sputtering over the interface layer, wherein the top diffusion layer comprises silicon nitride and is formed using reactive sputtering in a nitrogen plasma environment, wherein a material of the interface layer is at least about 50% amorphous, and forming a barrier layer disposed between the reflective layer and the top dielectric layer, wherein the barrier layer comprises nickel, titanium, and niobium, and wherein the barrier layer is in direct physical contact with both the reflective layer and the top dielectric layer.

* * * * *